United States Patent
Kishida et al.

(10) Patent No.: US 9,607,765 B2
(45) Date of Patent: Mar. 28, 2017

(54) COMPOSITION FOR CERAMIC SUBSTRATES AND CERAMIC CIRCUIT COMPONENT

(71) Applicant: Murata Manufacturing Co., Ltd., Nagaokakyo-shi, Kyoto-fu (JP)

(72) Inventors: Kazuo Kishida, Nagaokakyo (JP); Seiji Fujita, Nagaokakyo (JP); Yuichi Iida, Nagaokakyo (JP)

(73) Assignee: MURATA MANUFACTURING CO., LTD., Nagaokakyo-Shi, Kyoto-Fu (JP)

(*) Notice: Subject to any disclaimer, the term of this patent is extended or adjusted under 35 U.S.C. 154(b) by 0 days.

(21) Appl. No.: 14/953,976

(22) Filed: Nov. 30, 2015

(65) Prior Publication Data

US 2016/0086732 A1 Mar. 24, 2016

Related U.S. Application Data

(63) Continuation of application No. PCT/JP2014/063274, filed on May 20, 2014.

(30) Foreign Application Priority Data

Jun. 5, 2013 (JP) .................................. 2013-118433

(51) Int. Cl.
  *C03C 14/00* (2006.01)
  *H05K 1/03* (2006.01)
  (Continued)

(52) U.S. Cl.
  CPC .......... *H01G 4/1209* (2013.01); *C03C 3/064* (2013.01); *C03C 3/091* (2013.01); *C03C 8/02* (2013.01);
  (Continued)

(58) Field of Classification Search
  CPC ..... C03C 14/00; C03C 14/04; C03C 10/0036; C03C 10/0045; H05K 1/306; H05K 1/0306; H01B 3/12
  See application file for complete search history.

(56) References Cited

U.S. PATENT DOCUMENTS 4,687,749 A * 8/1987 Beall .................. C03C 10/0045
  501/4
6,372,676 B1 * 4/2002 Kishida ................ C03C 14/004
  501/32

(Continued)

FOREIGN PATENT DOCUMENTS

JP  S63-307141 A  12/1988
JP  2713376 B2  2/1999

(Continued)

OTHER PUBLICATIONS

International Search Report issued for PCT/JP2014/063274, date of mailing Aug. 26, 2014.

(Continued)

*Primary Examiner* — Karl Group
(74) *Attorney, Agent, or Firm* — Arent Fox LLP

(57) ABSTRACT

A composition for ceramic substrates that includes a mixture of borosilicate glass powder and ceramic powder. The borosilicate glass powder contains 4% to 8% by weight $B_2O_3$, 38% to 44% by weight $SiO_2$, 3% to 10% by weight $Al_2O_3$, and 40% to 48% by weight MO, where MO is at least one selected from CaO, MgO, and BaO. The mixing proportions of the borosilicate glass powder and the ceramic powder are 50% to 56% by weight the borosilicate glass powder and 50% to 44% by weight the ceramic powder. The ceramic powder has an average particle diameter D50 of 0.4 to 1.5 μm.

20 Claims, 1 Drawing Sheet

(51) Int. Cl.

| | | |
|---|---|---|
| *H01G 4/12* | (2006.01) | |
| *C03C 8/14* | (2006.01) | |
| *C03C 3/064* | (2006.01) | |
| *C03C 3/091* | (2006.01) | |
| *C03C 8/02* | (2006.01) | |
| *H01B 3/12* | (2006.01) | |
| *C03C 10/00* | (2006.01) | |
| *H01G 4/008* | (2006.01) | |
| *H01G 4/232* | (2006.01) | |
| *H01G 4/30* | (2006.01) | |
| *H05K 3/46* | (2006.01) | |
| *H01G 4/20* | (2006.01) | |

(52) U.S. Cl.
CPC ............ *C03C 8/14* (2013.01); *C03C 10/0009* (2013.01); *C03C 14/00* (2013.01); *C03C 14/006* (2013.01); *H01B 3/12* (2013.01); *H01G 4/0085* (2013.01); *H01G 4/232* (2013.01); *H01G 4/30* (2013.01); *H05K 1/0306* (2013.01); *C03C 2214/20* (2013.01); *H01G 4/129* (2013.01); *H01G 4/20* (2013.01); *H05K 3/4629* (2013.01); *H05K 2201/096* (2013.01)

(56) References Cited

U.S. PATENT DOCUMENTS

| | | | | |
|---|---|---|---|---|
| 6,376,055 | B1 * | 4/2002 | Kishida | ............... C03C 8/14 |
| | | | | 257/E23.009 |
| 6,448,195 | B2 * | 9/2002 | Kishida | ............... C03C 8/14 |
| | | | | 257/E23.009 |
| 6,835,682 | B2 * | 12/2004 | Cho | ............... C03C 3/064 |
| | | | | 428/434 |
| 8,304,357 | B2 * | 11/2012 | Imakita | ............... C03C 12/00 |
| | | | | 257/100 |
| 2002/0019304 | A1 | 2/2002 | Kishida et al. | |
| 2014/0301053 | A1 * | 10/2014 | Iida | ............... H05K 3/4629 |
| | | | | 361/760 |

FOREIGN PATENT DOCUMENTS

| | | |
|---|---|---|
| JP | 2000-351668 A | 12/2000 |
| JP | 2005-298259 A | 10/2005 |
| JP | 2010-052970 A | 3/2010 |
| WO | WO 2011021484 A1 | 2/2011 |

OTHER PUBLICATIONS

Written Opinion of the International Searching Authority issued for PCT/JP2014/063274, date of mailing Aug. 26, 2014.

* cited by examiner

COMPOSITION FOR CERAMIC SUBSTRATES AND CERAMIC CIRCUIT COMPONENT

CROSS REFERENCE TO RELATED APPLICATIONS

The present application is a continuation of International application No. PCT/JP2014/063274, filed May 20, 2014, which claims priority to Japanese Patent Application No. 2013-118433, filed Jun. 5, 2013, the entire contents of each of which are incorporated herein by reference.

FIELD OF THE INVENTION

The present invention relates to a composition for ceramic substrates and a ceramic circuit component. In particular, the present invention relates to a composition that is used for ceramic substrates and can be sintered at low temperatures of 1000° C. or less, and to a ceramic circuit component such as a multilayer or thick-film hybrid one incorporating this composition as a structural element.

BACKGROUND OF THE INVENTION

A composition for ceramic substrates of interest to the present invention is described in, for example, Japanese Unexamined Patent Application Publication No. 2000-351668 (Patent Document 1). The composition for ceramic substrates is a mixture of borosilicate glass powder and ceramic powder, the borosilicate glass powder containing 5% to 17.5% by weight $B_2O_3$, 28% to 44% by weight $SiO_2$, 0% to 20% by weight $Al_2O_3$, and 36% to 50% by weight MO (MO representing at least one selected from CaO, MgO, and BaO). The composition contains 40% to 49% by weight the borosilicate glass powder and 60% to 51% by weight the ceramic powder.

This composition for ceramic substrates, which can be sintered at low temperatures of 1000° C. or less, can be fired with a metal for making low-resistance metal-based conductor circuits, such as Ag- or Cu-based ones, in the production of a ceramic circuit component having such conductor circuits. Ceramic substrates containing this composition as a structural element, furthermore, offer high mechanical strength, a low dielectric constant, low loss, and a high thermal expansion coefficient which are all required of substrates, thereby providing ceramic circuit components such as multilayer ones having good characteristics and high reliability.

Patent Document 1: Japanese Unexamined Patent Application Publication No. 2000-351668

SUMMARY OF INVENTION

Thinning the ceramic layers in a ceramic substrate made using the composition for ceramic substrates described in Patent Document 1 can, however, lead to insufficient reliability regarding insulation between the ceramic layers.

An object of the present invention is therefore to provide a composition for ceramic substrates whereby ceramic substrates can be obtained with excellent insulation reliability.

Another object of the present invention is to provide a ceramic circuit component that includes a ceramic substrate made using this composition for ceramic substrates.

The present invention is first directed to a composition for ceramic substrates.

The composition for ceramic substrates according to an aspect of the present invention is a mixture of borosilicate glass powder and ceramic powder. The borosilicate glass powder contains 4% to 8% by weight $B_2O_3$, 38% to 44% by weight $SiO_2$, 3% to 10% by weight $Al_2O_3$, and 40% to 48% by weight MO (MO representing at least one selected from CaO, MgO, and BaO). The mixing proportions of the borosilicate glass powder and the ceramic powder are designed so that the composition contains 50% to 56% by weight the borosilicate glass powder and 50% to 44% by weight the ceramic powder. The ceramic powder has an average particle diameter D50 of 0.4 to 1.5 μm.

The composition for ceramic substrates according to an aspect of the present invention is therefore characterized in that the borosilicate glass powder content is higher than that described in Patent Document 1 and the ceramic powder is used in the form of fine particles. These features contribute to densification of ceramic substrates made using the composition for ceramic substrates.

The composition for ceramic substrates according to another aspect of the present invention, preferably, further contains a crystallinity modifier to control the timing and degree of the crystallization of the borosilicate glass.

The present invention is also directed to a ceramic circuit component that includes a ceramic substrate obtained through the shaping and firing of such a composition for ceramic substrates as described above and a conductor section formed in relation to the ceramic substrate.

The composition according to the present invention for ceramic substrates has a relatively high borosilicate glass powder content, ensuring sufficient softening and viscous flow of glass during firing, and incorporates ceramic powder in the form of fine particles, allowing a dense sintered body to be obtained. Ceramic substrates made using this composition therefore offer enhanced insulation reliability.

The composition according to the present invention for ceramic substrates can further contain a crystallinity modifier to control the timing and degree of the crystallization of the borosilicate glass. In the production of a ceramic circuit component, therefore, it is possible to limit the thinning of ceramic layers that occurs as an influence of shrinkage behavior of the cosintered conductor section, while preserving the state of softening of glass required for the densification of the ceramic substrate. This further contributes to improving insulation reliability.

DETAILED DESCRIPTION OF THE PREFERRED EMBODIMENTS

Figure 1:
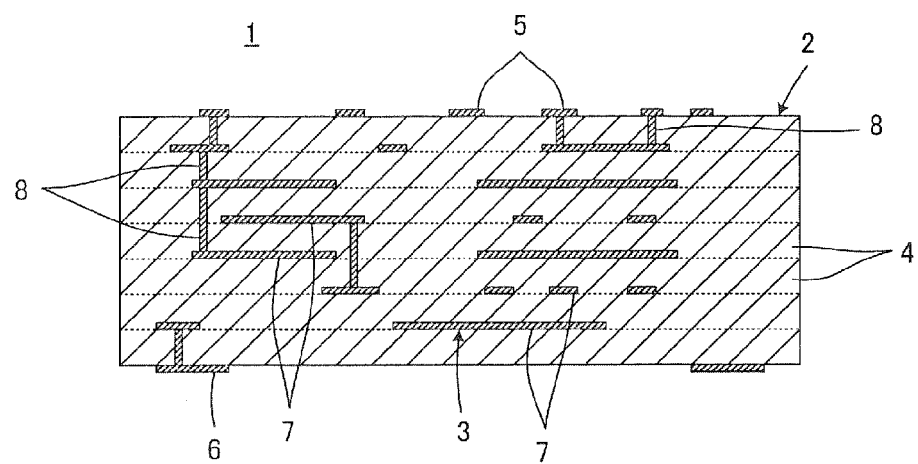
FIG. 1 is a cross-sectional diagram illustrating a ceramic circuit component 1 according to an embodiment of the present invention.

The composition according to the present invention for ceramic substrates is a mixture of borosilicate glass powder and ceramic powder such as alumina powder. The borosilicate glass powder undergoes softening and viscous flow during the firing process, thereby serving as a sintering aid that allows the ceramic substrate to be sintered at 1000° C. or less.

The mixing proportions of the borosilicate glass powder and the ceramic powder are selected so that the borosilicate glass powder content is in the range of 50% to 56% by weight and the ceramic powder content 50% to 44% by weight. As demonstrated by the Experiments below, making the proportion of the borosilicate glass powder less than 50% by weight will cause insufficient densification of the ceramic substrate, and a proportion of more than 56% by weight will lead to sufficient densification of the ceramic substrate but tends to make more likely the deformation of the ceramic that occurs as an influence of the conductor section.

The structural components of the borosilicate glass powder include $B_2O_3$ and $SiO_2$ as glass-network-constructing oxides, MO as a glass-network-modifying oxide (MO representing at least one selected from CaO, MgO, and BaO), and $Al_2O_3$ as a glass-network-mediating oxide, which induces the construction of the network in concert with the network-modifying oxide. The proportions of these oxides are adjusted so as to make the borosilicate glass powder able to serve as, as mentioned above, a sintering aid that allows the ceramic substrate to be sintered at 1000° C. or less.

In more detail, $B_2O_3$, one of the glass-network-constructing oxides $B_2O_3$ and $SiO_2$, is an oxide that reduces the softening temperature and promotes viscous flow, and its quantity is selected within the range of 4% to 8% by weight. As demonstrated by the Experiments below, a $B_2O_3$ content of less than 4% by weight will cause poor softening and fluidity of glass and therefore insufficient densification of the ceramic substrate, and the presence of $B_2O_3$ more than 8% by weight will produce sufficient densification to the ceramic substrate but tends to make more likely the deformation of the ceramic that occurs as an influence of the conductor section and to cause a low Q value of the resulting ceramic substrate.

As regards $SiO_2$, another glass-network-constructing oxide, its percentage content is selected within the range of 38% to 44% by weight. If $SiO_2$ is less than 38% by weight, it is difficult to obtain a ceramic substrate with a low dielectric constant. The presence of more than 44% by weight $SiO_2$ will cause an increased softening point of glass and therefore insufficient densification of the ceramic substrate.

The quantity of $Al_2O_3$, a glass-network-mediating oxide, is selected within the range of 3% to 10% by weight. $Al_2O_3$ is a component that serves as a glass-network-mediating oxide and stabilizes the structure of glass, and an $Al_2O_3$ content of less than 3% by weight will cause reduced stability of glass, allowing self-crystallization of the glass to start at low temperatures, leading to insufficient densification of the ceramic substrate. The presence of more than 10% by weight $Al_2O_3$ will cause poor softening and fluidity of glass, also resulting in the ceramic substrate being insufficiently densified.

MO, a glass-network-modifying oxide, is a component that promotes the softening and fluidity of glass, and its quantity is selected within the range of 40% to 48% by weight. An MO content of less than 40% by weight will cause poor softening and fluidity of glass and therefore insufficient densification of the ceramic substrate. The presence of more than 48% by weight MO will lead to a lack of stability of glass and allow self-crystallization of the glass to start at low temperatures, also leading to the ceramic substrate being insufficiently densified.

The average particle diameter D50 of the ceramic powder contained in the composition for ceramic substrates is selected to be in the range of 0.4 to 1.5 µm. Making the average particle diameter D50 of the ceramic powder less than 0.4 µm will lead to too high sinterability, and a D50 of more than 1.5 µm will cause poor dispersibility with glass, leading to a low density and insufficient sinterability of the shaped composition.

As described above, the average particle diameter D50 of the ceramic powder is selected to be in the range of 0.4 to 1.5 µm. The self-crystallization of the borosilicate glass tends to be, however, more effectively prevented with increasing fineness of the particles of the ceramic powder. In this case it is preferred to control the timing and degree of the crystallization of the borosilicate glass by adding, to the composition for ceramic substrates, a crystallinity modifier that will serve as a crystallization accelerator.

To be more specific, when the glass is capable of self-crystallization, high crystallinity due to the crystallization starting at low temperatures can cause the process of densification that utilizes the softening and viscous flow of the glass to be incomplete, resulting in unsatisfactory mechanical strength of the ceramic substrate. When the glass is incapable of or resistant to self-crystallization, the achievement of the densification process based on the softening and viscous flow of the glass can be sufficient, but cosintering with the conductor section often causes the ceramic section to deform as an influence of shrinkage behavior of the conductor section, leading in some cases to reduced reliability in terms of insulation between ceramic layers (hereinafter referred to as "the interlayer insulation reliability") associated with thinning of the ceramic layers. In brief, the glass softening and viscous flow-based process of densification can cause thinning of ceramic layers as an influence of the conductor section.

Taking, as a solution to this, a method that involves forcedly crystallizing glass incapable of or resistant to self-crystallization using a crystallization accelerator allows the crystallization of the glass to proceed to the necessary extent at a constantly high crystallization temperature. The aforementioned crystallinity modifier, a material intended to be a crystallization accelerator, enhances the process of densification that utilizes the softening and viscous flow of glass to such a level that the required degree of interlayer reliability is achieved, as well as controlling the process to increase crystallinity. In the production of a multilayer ceramic substrate, therefore, the crystallinity modifier works to limit the deformation (thinning) of ceramic layers caused by the conductor section located between the ceramic layers, thereby allowing high interlayer insulation reliability to be maintained.

This crystallinity modifier can be, for example, crystallized wollastonite ($CaSiO_3$). When crystallized wollastonite is used, its quantity is preferably in the range of 0.005 to 0.1 parts by weight, more preferably 0.005 to 0.04 parts by weight, with the total quantity of the glass and ceramic powders as 100 parts by weight.

The preferred quantities of crystallized wollastonite as a crystallinity modifier are, as presented above, so small that weighing precision issues can be caused. The use of any material that contains a lower proportion of crystalline substance than crystallized wollastonite or the use of any other crystallized material therefore solves the weighing precision issues. For example, crystallized anorthite ($CaAl_2Si_2O_8$) can be used in a greater amount than crystallized wollastonite. When crystallized anorthite is used, its quantity is preferably in the range of 0.03 to 0.2 parts by weight, more preferably 0.05 to 0.15 parts by weight, with the total quantity of the glass and ceramic powders as 100 parts by weight.

Such a composition for ceramic substrates as described above is advantageously used to produce a ceramic circuit component that includes a ceramic substrate obtained through the shaping and firing of the composition and a conductor section formed in relation to this ceramic substrate.

FIG. 1 is a cross-sectional diagram schematically illustrating an example of this ceramic circuit component, a multilayer ceramic circuit component 1 according to an embodiment of the present invention. The ceramic circuit component 1, in general terms, includes a ceramic substrate 2 and a conductor section 3 formed inside and/or on the surface of this ceramic substrate 2.

The ceramic substrate 2, obtained through the firing of a ceramic article which is a stack of multiple green sheets containing a composition for ceramic substrates having such a formulation as described above, has multiple ceramic layers 4 provided through the firing of each of the multiple green sheets.

The conductor section 3 is formed through, for example, cofiring of the aforementioned ceramic article and a conductive paste that contains a conductive ingredient based on at least one metal selected from Ag, Ag—Pd, Ag—Pt, Cu, and Au. The conductor section 3 includes outer electrodes 5 and 6 formed on the surface of the ceramic substrate 2 and inner electrodes 7 and conductive vias 8 formed inside the ceramic substrate 2.

[Experiments]

The following describes the composition according to the present invention for ceramic substrates in more detail by presenting some experiments.

Table 1 summarizes the formulations of the compositions for ceramic substrates produced in the Experiments.

First, oxides or carbonates as starting materials were compounded to the formulation of glass presented in Table 1, and the resulting mixture was melted in a Pt crucible at a temperature of 1300° C. to 1700° C. for 1 hour, the temperature depending on the formulation of glass used. The glass melt was then rapidly cooled, and the cooled material was pulverized into a $CaO$—$Al_2O_3$—$SiO_2$—$B_2O_3$ glass powder according to each sample.

Separately, ceramic powders having the average particle diameter D50 specified in Table 1, such as alumina powder, were prepared as fillers.

Furthermore, crystallized wollastonite and crystallized anorthite were prepared as crystallinity modifiers.

Each of the glass powders obtained as above and the ceramic powder(s) as filler were then mixed in the proportions specified under "Glass content" and "Filler/Quantity" in Table 1, optionally with crystallinity modifier(s) for some samples. The resulting mixtures were thoroughly mixed with a solvent, a binder, and a plasticizer, yielding glass ceramic slurry. In Table 1, the quantities of the crystallinity modifiers are in the unit of parts by weight with the total quantity of the glass and ceramic powders as 100 parts by weight.

The obtained glass ceramic slurry was shaped into a sheet using a doctor blade, yielding glass ceramic green sheets.

The green sheets according to each sample obtained in this way were then fabricated into several forms of the sample, and the "Crystallinity," "Log IR" (insulation resistance), "Interlayer distance," "$\varepsilon r$" (relative dielectric constant), "Q," and "Transverse strength" in Table 2 were determined.

TABLE 1

| Sample number | Glass content (% by weight) | Filler | Quantity (% by weight) | D50 (μm) | Crystallinity modifier Crystal species | Quantity (parts by weight) | MO (% by weight) CaO | MgO | BaO | $Al_2O_3$ (% by weight) | $B_2O_3$ (% by weight) | $SiO_2$ (% by weight) |
|---|---|---|---|---|---|---|---|---|---|---|---|---|
| 1 | 50 | Alumina | 50 | 0.8 | — | 0 | 40 | 0 | 0 | 9 | 7 | 44 |
| 2 | 55 | Alumina | 45 | 0.8 | — | 0 | 45 | 0 | 0 | 3 | 8 | 44 |
| 3 | 52 | Alumina | 48 | 0.8 | — | 0 | 46 | 0 | 0 | 10 | 6 | 38 |
| 4 | 56 | Alumina | 44 | 1.5 | — | 0 | 48 | 0 | 0 | 6 | 5 | 41 |
| 5 | 50 | Alumina | 50 | 0.4 | — | 0 | 43 | 0 | 0 | 5 | 8 | 44 |
| 6 | 52 | Alumina | 48 | 1.0 | — | 0 | 46 | 0 | 0 | 8 | 6 | 40 |
| 7 | 56 | Alumina | 44 | 1.0 | — | 0 | 45 | 0 | 0 | 4 | 7 | 44 |
| 8 | 50 | Alumina | 50 | 0.6 | — | 0 | 47 | 0 | 0 | 6 | 4 | 43 |
| 9 | 54 | Alumina | 46 | 0.9 | — | 0 | 36 | 10 | 0 | 5 | 6 | 43 |
| 10 | 51 | Alumina | 49 | 0.9 | — | 0 | 39 | 0 | 5 | 7 | 7 | 42 |
| 11 | 52 | Alumina | 48 | 0.9 | Wollastonite | 0.005 | 44 | 0 | 0 | 7 | 6 | 43 |
| 12 | 52 | Alumina | 48 | 0.9 | Wollastonite | 0.02 | 44 | 0 | 0 | 7 | 6 | 43 |
| 13 | 52 | Alumina | 48 | 0.9 | Wollastonite | 0.04 | 44 | 0 | 0 | 7 | 6 | 43 |
| 14 | 52 | Alumina | 48 | 0.9 | Wollastonite | 0.1 | 44 | 0 | 0 | 7 | 6 | 43 |
| 15 | 52 | Alumina | 48 | 0.9 | Anorthite | 0.1 | 44 | 0 | 0 | 7 | 6 | 43 |
| 16 | 51 | Alumina Forsterite | 39 10 | 1.0 0.9 | — | 0 | 45 | 0 | 0 | 6 | 7 | 42 |
| *17 | 58 | Alumina | 42 | 0.6 | — | 0 | 44 | 0 | 0 | 4 | 8 | 44 |
| *18 | 48 | Alumina | 52 | 1.0 | — | 0 | 48 | 0 | 0 | 6 | 5 | 41 |
| *19 | 54 | Alumina | 46 | 1.2 | — | 0 | 42 | 0 | 0 | 6 | 6 | 46 |
| *20 | 52 | Alumina | 48 | 0.9 | — | 0 | 47 | 0 | 0 | 9 | 8 | 36 |
| *21 | 53 | Alumina | 47 | 0.9 | — | 0 | 43 | 0 | 0 | 6 | 10 | 41 |
| *22 | 54 | Alumina | 46 | 1.0 | — | 0 | 47 | 0 | 0 | 8 | 2 | 43 |
| *23 | 55 | Alumina | 45 | 0.8 | — | 0 | 42 | 0 | 0 | 12 | 6 | 40 |
| *24 | 52 | Alumina | 48 | 0.8 | — | 0 | 47 | 0 | 0 | 1 | 9 | 43 |
| *25 | 53 | Alumina | 47 | 0.9 | — | 0 | 50 | 0 | 0 | 4 | 6 | 40 |
| *26 | 55 | Alumina | 45 | 0.9 | — | 0 | 38 | 0 | 0 | 10 | 8 | 44 |
| *27 | 51 | Alumina | 49 | 1.7 | — | 0 | 45 | 0 | 0 | 6 | 6 | 43 |
| *28 | 55 | Alumina | 45 | 0.2 | — | 0 | 42 | 0 | 0 | 9 | 7 | 42 |

"Crystallinity":

The crystallinity was determined as follows.

A sample ceramic substrate was produced through the firing of a raw multilayer body, which was a stack of multiple green sheets and had no conductor section, using a predetermined temperature profile where the highest temperature was not higher than 1000° C. The fired ceramic substrate was then pulverized in a mortar, and powder XRD ($2\theta=10°$ to $60°$) was performed to detect crystal phases and determine peak intensities. The peak intensity for wollastonite, $2\theta=30°$, divided by that for alumina, $2\theta=25.6°$, was defined as crystallinity.

"Log IR" (Insulation Resistance):

The Log IR, intended to be a measure of interlayer insulation reliability, was determined as follows.

Figure 2:
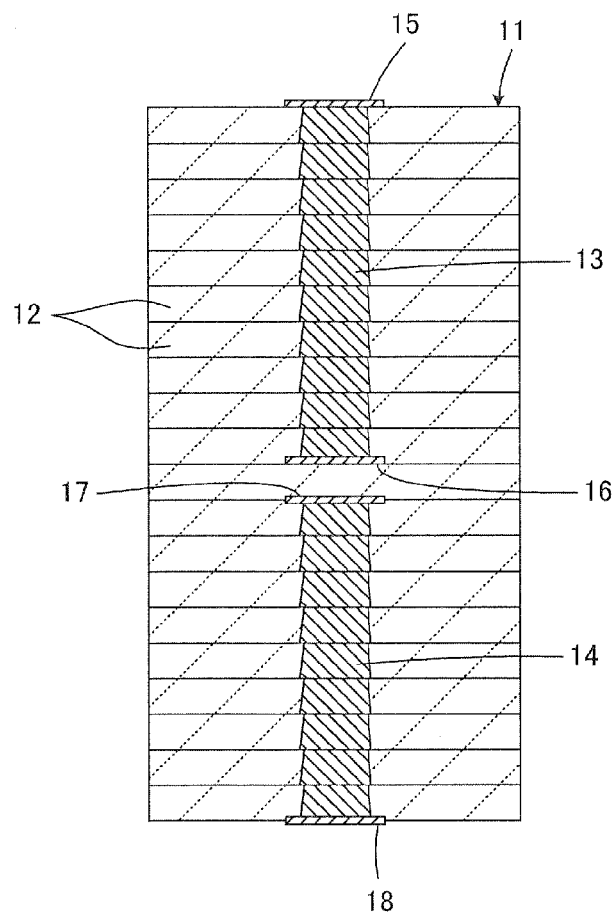
FIG. 2 is an enlarged cross-sectional view of part of a ceramic substrate 11 prepared as a sample in Experiments.

A multilayer ceramic substrate 11 having such a cross-section as illustrated in FIG. 2 was produced through the firing of a raw multilayer body, which was a stack of multiple green sheets, using a predetermined temperature profile where the highest temperature was not higher than 1000° C. This ceramic substrate 11 had a stack of multiple ceramic layers 12, with two conductive vias 13 and 14 formed in alignment with each other in the direction of stacking. Pad electrodes 15 and 16 were coupled to the ends of the conductive via 13, and pad electrodes 17 and 18 were coupled to the ends of the conductive via 14. The pad electrodes 15 and 18 were located on the top and bottom surfaces, respectively, of the ceramic substrate 11, and the pad electrodes 16 and 17 faced each other with one ceramic layer 12 therebetween.

The formation of the conductive vias 13 and 14 was through the creation of a hole using a laser puncher through green sheets to be used as the ceramic layers 12 and the filling of the through-hole with a conductive paste. The formation of the pad electrodes 15 to 18 were through screen printing of the conductive paste. The conductive paste was Ag paste obtained through the mixing of predetermined proportions of a Ag powder, a solvent, and an organic binder and subsequent dispersion of the resulting mixture with a three-roll mill.

For this ceramic substrate 11, the insulation resistance of the ceramic layer 12 sandwiched between the pad electrodes 16 and 17 was measured with the pad electrodes 15 and 18 on the top and bottom surfaces, respectively, as terminals. The ceramic layer 12 sandwiched between the pad electrodes 16 and 17 was made from a green sheet whose thickness after firing would be 12.5 μm excluding the pad electrodes. The diameter of the conductive vias 13 and 14 was 100 μm, and the diameter of the pad electrodes 15 to 18 was 200 μm.

The measurement of insulation resistance was through insulation reliability testing. The insulation reliability testing was based on the pressure cooker test, and the first step was to apply DC 50 V to the ceramic substrate 11 and check the insulation resistance at 200 hours. The conditions for the pressure cooker test consisted of 121° C. and 85% RH. The sample after the pressure cooker was then exposed to DC 50 V for 60 seconds, and the leakage current measured was used to determine the Log IR. Any sample with a Log IR of less than 10 was determined to be of poor insulation.

"Interlayer Distance":

The interlayer distance is the thickness of the ceramic layer 12 sandwiched between the pad electrodes 16 and 17 of the ceramic substrate 11 illustrated in FIG. 2 and was determined as follows.

The ceramic substrate 11 in FIG. 2, fabricated in the way described above, was cross-sectioned, and the thickness of the ceramic layer 12 sandwiched between the pad electrodes 16 and 17 was determined through the observation of the cross-section. As mentioned above, the ceramic layer 12, the site of measurement, was made from a green sheet whose thickness after firing would be 12.5 μm excluding the pad electrodes.

"$\epsilon r$" (Relative Dielectric Constant):

The $\epsilon r$ (relative dielectric constant) was determined as follows.

A ceramic substrate was produced through the firing of a raw multilayer body, which was a stack of multiple green sheets and had no conductor section, using a predetermined temperature profile where the highest temperature was not higher than 1000° C. The aforementioned Ag paste was applied only to the top and bottom surfaces of the ceramic substrate, forming electrodes, and the resulting structure was used as a sample. The electrostatic capacity of this sample was measured using an LCR meter under the conditions of a frequency of 1 MHz and a voltage of 1 V rms. The electrode area, electrode spacing, and measured electrostatic capacity of the sample were used to calculate the $\epsilon r$ (relative dielectric constant).

"Q":

The Q was determined as follows.

For a sample equivalent to that used to determine the $\epsilon r$ (relative dielectric constant) above, the dielectric loss was measured using an LCR meter under the conditions of a frequency of 1 MHz and a voltage of 1 V rms. The measured dielectric loss was used to determine the Q.

"Transverse Strength":

A ceramic substrate measuring 50 mm long, 4 mm wide, and 0.5 mm thick was produced through the firing of a raw multilayer body, which was a stack of multiple green sheets and had no conductor section, using a predetermined temperature profile where the highest temperature was not higher than 1000° C. The transverse strength (three-point bending) of this ceramic substrate as a sample was measured using Autograph, basically in accordance with a JIS standard (JIS R-1601). The differences from the JIS standard consisted of the thickness of the sample different from that specified in the JIS standard and the omission of the polishing of the surface and edge portion of the sample.

TABLE 2

| Sample number | Crystallinity | LogIR | Interlayer distance (μm) | $\epsilon r$ | Q | Transverse strength (MPa) |
| --- | --- | --- | --- | --- | --- | --- |
| 1 | 0.1 | 11 | 8 | 9.0 | 2000 | 310 |
| 2 | 0.1 | 11 | 8 | 9.0 | 1900 | 290 |
| 3 | 0.1 | 12 | 8 | 9.2 | 2100 | 300 |
| 4 | 0.1 | 11 | 8 | 9.3 | 2000 | 280 |
| 5 | 0 | 11 | 7 | 9.1 | 2300 | 330 |
| 6 | 0.1 | 12 | 8 | 9.2 | 1900 | 290 |
| 7 | 0.1 | 11 | 8 | 9.1 | 1800 | 270 |
| 8 | 0.1 | 12 | 8 | 9.2 | 2200 | 320 |
| 9 | 0.1 | 12 | 8 | 9.2 | 1400 | 280 |
| 10 | 0.1 | 11 | 8 | 9.2 | 1700 | 300 |
| 11 | 0.3 | 12 | 8 | 9.1 | 2500 | 300 |
| 12 | 0.4 | 11 | 9 | 9.0 | 2700 | 280 |
| 13 | 0.8 | 11 | 10 | 8.9 | 3200 | 280 |
| 14 | 1.8 | 11 | 11 | 8.3 | 4100 | 260 |
| 15 | 0.3 | 11 | 10 | 9.0 | 2800 | 280 |
| 16 | 0.1 | 12 | 8 | 9.1 | 2200 | 290 |
| *17 | 0 | 7 | 4 | 8.9 | 1500 | 240 |
| *18 | 0.1 | 6 | 10 | 9.5 | 3200 | 250 |
| *19 | 0.1 | 7 | 9 | 8.8 | 2800 | 230 |
| *20 | 0.1 | 11 | 10 | 9.6 | 2000 | 260 |
| *21 | 0 | 12 | 6 | 9.3 | 1000 | 280 |
| *22 | 0.1 | 6 | 9 | 9.2 | 2400 | 260 |

TABLE 2-continued

| Sample number | Crystallinity | LogIR | Interlayer distance (μm) | εr | Q | Transverse strength (MPa) |
|---|---|---|---|---|---|---|
| *23 | 0.1 | 7 | 10 | 9.1 | 2700 | 240 |
| *24 | 0.4 | 6 | 11 | 8.8 | 3400 | 300 |
| *25 | 0.5 | 6 | 10 | 8.8 | 3300 | 310 |
| *26 | 0.1 | 7 | 10 | 8.9 | 2800 | 260 |
| *27 | 0.2 | 8 | 11 | 9.0 | 2400 | 230 |
| *28 | 0 | 8 | 9 | 8.9 | 2700 | 250 |

In Tables 1 and 2, the asterisk mark (*) appended to sample numbers means that the sample was a comparative example out of the scope of the present invention.

For samples 1 to 16 produced as examples falling within the scope of the present invention, as summarized in Table 2, the interlayer insulation reliability was excellent as demonstrated by Log IR not less than 10. The εr was 9.3 or less, lower than 9.7 of a 99.5% alumina substrate, and the Q values were as great as 1400 to 4100. The transverse strength measurements were also high, ranging from 260 to 330 MPa.

For sample 5, one of samples 1 to 16 falling within the scope of the present invention, the crystallinity was 0 as presented in Table 2. Sample 5, in which crystallization was thus disrupted, had a small interlayer distance of 7 μm because long and continuous softening and flow of glass during firing allowed, with reference to FIG. 2, the ceramic substrate 11 to shrink and deform to a great extent and thereby assisted the conductive vias 13 and 14 and the pad electrodes 15 to 18 to make the ceramic layer 12 thinner. The transverse strength was as high as 330 MPa, suggesting that the structure itself was dense.

For sample 14, as presented in Table 1, wollastonite was used as a crystallinity modifier in a relatively large amount, 0.1 parts by weight, leading to a high crystallinity of 1.8 as indicated in Table 2. As a result, densification based on the softening and flow of glass was slow to proceed, and the transverse strength, 260 MPa, was lower than that of the other samples with a lower crystallinity. This level of transverse strength is, however, practically acceptable.

As regards sample 17, a comparative example, the glass content was 58% by weight, more than 56% by weight, as presented in Table 1. As a result, densification proceeded sufficiently, but the deformation of ceramic layers as an influence of the conductor section was significant. To be more specific, with reference to FIG. 2, the portion of the ceramic layer 12 sandwiched between the pad electrodes 16 and 17 experienced a large decrease in thickness. Thus as summarized in Table 2, the Log IR as a measure of interlayer insulation reliability was low, the interlayer distance was as short as 4 μm, and the transverse strength was also rather low, 240 MPa. Furthermore, the crystallinity was 0.

For sample 18, as presented in Table 1, the glass content was 48% by weight glass, less than 50% by weight. Densification thus proceeded insufficiently, and hence as can be seen from Table 2 the sintered body was insufficient for adequate interlayer insulation reliability to be achieved, although the interlayer distance was relatively long, 10 μm. The Log IR was low, and the transverse strength was also rather low, 250 MPa.

For sample 19, as presented in Table 1, the glass contained too much $SiO_2$. The resulting high softening point of the glass prevented densification from proceeding sufficiently, and hence as given in Table 2 the sintered body was insufficient for adequate interlayer insulation reliability to be achieved. The Log IR was low, and the transverse strength was also rather low, 230 MPa.

For sample 20, as presented in Table 1, the glass contained too little $SiO_2$, and hence as can be seen from Table 2 the relative dielectric constant was as large as 9.6, a level comparable to that of a 99.5% alumina substrate.

For sample 21, as presented in Table 1, the glass contained too much $B_2O_3$. The resulting crystallinity of 0, as in Table 2, facilitated the softening and flow of glass and densification, but the deformation of ceramic layers as an influence of the conductor section was significant. To be more specific, with reference to FIG. 2, the portion of the ceramic layer 12 sandwiched between the pad electrodes 16 and 17 experienced a large decrease in thickness. Furthermore, the Q value was as low as 1000.

For sample 22, as presented in Table 1, the glass contained too little $B_2O_3$. The resulting insufficient softening and flow of glass prevented densification from proceeding sufficiently, and hence as given in Table 2 the Log IR as a measure of interlayer insulation reliability was low.

For sample 23, as presented in Table 1, the glass contained too much $Al_2O_3$. The resulting insufficient softening and flow of glass prevented densification from proceeding sufficiently, and hence as given in Table 2 the Log IR as a measure of interlayer insulation reliability was low. Furthermore, the transverse strength was rather low, 240 MPa.

For sample 24, as can be seen from Table 1, the glass contained too little $Al_2O_3$. The resulting reduced stability of glass allowed self-crystallization of the glass to start at low temperatures, leading to insufficient densification. As a result, the Log IR as a measure of interlayer insulation reliability was low, as presented in Table 2.

For sample 25, as can be seen from Table 1, the alkaline earth metal, or MO (CaO), content of glass was too large. The resulting instability of glass allowed self-crystallization of the glass to start at low temperatures, leading to insufficient densification. As a result, the Log IR as a measure of interlayer insulation reliability was low, as presented in Table 2.

For sample 26, as can be seen from Table 1, the alkaline earth metal, or MO (CaO), content of glass was too small. The resulting insufficient viscous flow of glass led to insufficient densification. As a result, the Log IR as a measure of interlayer insulation reliability was low, as presented in Table 2.

For sample 27, as presented in Table 1, the average particle diameter D50 of filler was too large. Poor dispersibility with glass led to a low density and insufficient sinterability of the shaped composition. Hence as summarized in Table 2 the transverse strength was rather low, 230 MPa, and the Log IR as a measure of interlayer insulation reliability was also low.

For sample 28, as presented in Table 1, the average particle diameter D50 of filler was too small, making sinterability too high. The sintered body was therefore rather oversintered and contained pores as a result of foaming. As a result, the Log IR as a measure of interlayer insulation reliability was low, as presented in Table 2. The transverse strength was also rather low, 250 MPa. Furthermore, the crystallinity was 0.

REFERENCE SIGNS LIST

1 Ceramic circuit component
2 Ceramic substrate
3 Conductor section
4 Ceramic layers

The invention claimed is:

1. A composition for ceramic substrates, the composition comprising:
a mixture of 50% to 56% by weight of borosilicate glass powder and 50% to 44% by weight of ceramic powder, wherein the borosilicate glass powder contains:
4% to 8% by weight $B_2O_3$,
38% to 44% by weight $SiO_2$,
3% to 10% by weight $Al_2O_3$, and
40% to 48% by weight MO, where MO is at least one selected from CaO, MgO, and BaO, and
wherein the ceramic powder has an average particle diameter D50 of 0.4 to 1.5 μm. and the ceramic powder is alumina powder.

2. The composition according to claim 1, further comprising a crystallinity modifier.

3. The composition according to claim 2, wherein the crystallinity modifier is crystallized wollastonite.

4. The composition according to claim 3, wherein a quantity of the crystallized wollastonite is in a range of 0.005 to 0.1 parts by weight when a total quantity of the borosilicate glass powder and the ceramic powder is 100 parts by weight.

5. The composition according to claim 3, wherein a quantity of the crystallized wollastonite is in a range of 0.005 to 0.04 parts by weight when a total quantity of the borosilicate glass powder and the ceramic powder is 100 parts by weight.

6. The composition according to claim 2, wherein the crystallinity modifier is crystallized anorthite.

7. The composition according to claim 6, wherein a quantity of the crystallized anorthite is in a range of 0.03 to 0.2 parts by weight when a total quantity of the borosilicate glass powder and the ceramic powder is 100 parts by weight.

8. The composition according to claim 6, wherein a quantity of the crystallized anorthite is in a range of 0.05 to 0.15 parts by weight when a total quantity of the borosilicate glass powder and the ceramic powder is 100 parts by weight.

9. A ceramic circuit component comprising:
a ceramic substrate obtained through shaping and firing of a composition according to claim 1; and
a conductor section adjacent to the ceramic substrate.

10. A ceramic circuit component comprising:
a ceramic substrate comprising a composition according to claim 1; and
a conductor section adjacent to the ceramic substrate,
wherein the ceramic substrate and the conductor section are obtained by co-firing.

11. A composition for ceramic substrates, the composition comprising:
a mixture of 50% to 56% by weight of borosilicate glass powder and 50% to 44% by weight of ceramic powder; and
crystallized wollastonite,
wherein the borosilicate glass powder contains:
4% to 8% by weight $B_2O_3$,
38% to 44% by weight $SiO_2$,
3% to 10% by weight $Al_2O_3$, and
40% to 48% by weight MO, where MO is at least one selected from CaO, MgO, and BaO, and
wherein the ceramic powder has an average particle diameter D50 of 0.4 to 1.5 μm.

12. The composition according to claim 11, wherein a quantity of the crystallized wollastonite is in a range of 0.005 to 0.1 parts by weight when a total quantity of the borosilicate glass powder and the ceramic powder is 100 parts by weight.

13. The composition according to claim 11, wherein a quantity of the crystallized wollastonite is in a range of 0.005 to 0.04 parts by weight when a total quantity of the borosilicate glass powder and the ceramic powder is 100 parts by weight.

14. A ceramic circuit component comprising:
a ceramic substrate obtained through shaping and firing of a composition according to claim 11; and
a conductor section adjacent to the ceramic substrate.

15. A ceramic circuit component comprising:
a ceramic substrate comprising a composition according to claim 11; and
a conductor section adjacent to the ceramic substrate,
wherein the ceramic substrate and the conductor section are obtained by co-firing.

16. A composition for ceramic substrates, the composition comprising:
a mixture of 50% to 56% by weight of borosilicate glass powder and 50% to 44% by weight of ceramic powder; and
crystallized anorthite,
wherein the borosilicate glass powder contains:
4% to 8% by weight $B_2O_3$,
38% to 44% by weight $SiO_2$,
3% to 10% by weight $Al_2O_3$, and
40% to 48% by weight MO, where MO is at least one selected from CaO, MgO, and BaO, and
wherein the ceramic powder has an average particle diameter D50 of 0.4 to 1.5 μm.

17. The composition according to claim 16, wherein a quantity of the crystallized anorthite is in a range of 0.03 to 0.2 parts by weight when a total quantity of the borosilicate glass powder and the ceramic powder is 100 parts by weight.

18. The composition according to claim 16, wherein a quantity of the crystallized anorthite is in a range of 0.05 to 0.15 parts by weight when a total quantity of the borosilicate glass powder and the ceramic powder is 100 parts by weight.

19. A ceramic circuit component comprising:
a ceramic substrate obtained through shaping and firing of a composition according to claim 16; and
a conductor section adjacent to the ceramic substrate.

20. A ceramic circuit component comprising:
a ceramic substrate comprising a composition according to claim 16; and
a conductor section adjacent to the ceramic substrate,
wherein the ceramic substrate and the conductor section are obtained by co-firing.

* * * * *